United States Patent
Arvidsson et al.

[11] Patent Number: 5,892,920
[45] Date of Patent: Apr. 6, 1999

[54] DATA TRANSMISSION SYSTEM BUFFER WITH TREE SHAPED MULTIPLEXER CONTROLLED BY DIFFERENT SENDING AND RECEIVING CLOCK SPEEDS

[75] Inventors: Carl-Erik Arvidsson, Stockholm; Martin Lindblom, Täby, both of Sweden

[73] Assignee: Telefonaktiebolaget LM Ericsson, Stockholm, Sweden

[21] Appl. No.: 860,939

[22] PCT Filed: Jan. 19, 1996

[86] PCT No.: PCT/SE96/00049

§ 371 Date: Aug. 12, 1997

§ 102(e) Date: Aug. 12, 1997

[87] PCT Pub. No.: WO96/23252

PCT Pub. Date: Aug. 1, 1996

[30] Foreign Application Priority Data

Jan. 27, 1995 [SE] Sweden .................................. 9500289

[51] Int. Cl.⁶ ...................................................... G06F 7/00
[52] U.S. Cl. ............... 395/700.63; 365/221; 365/189.05; 365/189.01; 370/539; 370/541; 375/356
[58] Field of Search ............................... 364/926.1, 926.2, 364/926.5, 951; 365/221, 230.05, 189.05, 189.07, 189.01; 395/182.1, 200.19, 553, 200.61, 200.62, 200.63; 375/356; 370/307, 539, 541

[56] References Cited

U.S. PATENT DOCUMENTS

| | | |
|---|---|---|
| 4,244,046 | 1/1981 | Brouard et al. ........................... 370/62 |
| 4,504,943 | 3/1985 | Nagano et al. ........................... 370/79 |
| 4,803,654 | 2/1989 | Rasberry et al. . |
| 4,819,201 | 4/1989 | Thomas et al. ....................... 364/926.1 |
| 5,084,837 | 1/1992 | Matsumoto et al. ..................... 395/250 |
| 5,243,599 | 9/1993 | Barret et al. ............................. 370/112 |
| 5,305,253 | 4/1994 | Ward . |
| 5,319,597 | 6/1994 | Adachi . |

FOREIGN PATENT DOCUMENTS

| | | |
|---|---|---|
| 099 462 | 2/1984 | European Pat. Off. . |
| 394 599 | 10/1990 | European Pat. Off. . |
| 394599A1 | 10/1990 | European Pat. Off. . |

*Primary Examiner*—Dung C. Dinh
*Assistant Examiner*—Hieu Le
*Attorney, Agent, or Firm*—Burns, Doane, Swecker & Mathis, L.L.P.

[57] ABSTRACT

A data buffer includes a number of storing elements, a tree shaped structure of multiplexer elements, a write address generator, and a read address generator. The data storing elements have data inputs connected in parallel to an input for a data stream from a sending clock domain. The tree shaped structure of multiplexer elements is arranged for receiving data from the data storing elements, and emits on an output a data stream to a receiving clock domain. The write address generator generates, controlled by a write clock signal from the clock of the sending clock domain, write addresses for entering data from the sending clock domain into the data storing elements, one at a time. The read address generator generates, controlled by a read clock signal from the clock generator of the receiving clock domain, read addresses for reading out data storing elements in the same order as they were read in.

3 Claims, 4 Drawing Sheets

DATA TRANSMISSION SYSTEM BUFFER WITH TREE SHAPED MULTIPLEXER CONTROLLED BY DIFFERENT SENDING AND RECEIVING CLOCK SPEEDS

BACKGROUND

The present invention generally relates to data transmission with speeds of the order of magnitude of several Gigabits/sec between two clock domains, of which each may be constituted by e.g. a CPU, a part of an ATM switch or other equipment which sends and receives data. ATM allows transmission of large data quantities over arbitrary media with the use of data packages with a prescribed length and small overhead.

More specifically, the invention relates to a data transmission system, in which data streams are to be transmitted at a large speed between a sending clock domain and a receiving clock domain, which operate with mutually different clock speeds.

In two data transmission systems, which are operating with approximately the same clock frequency generated by two separate oscillators, one in each system, and which are to be connected and transmit data to each other, a certain drift may occur between the frequencies. Because of this a buffer must be inserted between the two systems, which may emit data faster than it receives it, or vice versa, depending on which system's clock frequency is the larger one.

In the U.S. Pat. No. 5,305,253 a memory with separate read and write buses, two address ring counters, one for write and one for read operations, and an alarm which detects when the buffer is empty and full, is described. Since it is very difficult to make memories with a reply time shorter than 7 ns without resorting to the use of GA, this solution is not usable at frequencies of the order of magnitude of Gigabits/sec.

In the U.S. Pat. No. 4,819,201 an asynchronous FIFO circuit is described which includes consecutive data storage registers, which relay incoming data if the following register is empty. When the FIFO circuit is empty data will accordingly be let through from the beginning of the register stack to its end. This may cause risk for degradation of data and is furthermore a slow solution.

Among other publications relating to the same subject, the following may be mentioned.

U.S. Pat. No. 5,319,597 "FIFO memory and line buffer",

U.S. Pat. No. 5,084,837 "FIFO buffer with folded data transmission path permitting selective bypass of storage", U.S. Pat. No. 4,803,654 "Circular first-in, first-out buffer system for generating input and output addresses for read/write memory independently".

SUMMARY

An object of the present invention is to provide a fast, small and simple data buffer between the two clock domains in the data transmission system defined above by way of introduction.

This is achieved according to the invention through a data buffer, which includes a number of data storage elements, a tree shaped structure of multiplexer elements, a write address generator and a read address generator. The data storage elements have data inputs connected in parallel to an input for a data stream from the sending clock domain. The tree shaped structure of multiplexer elements is arranged to receive data from the data storage elements, and emits on an output a data stream to the receiving clock domain. The write address generator generates, controlled by a write clock signal from the clock of the sending clock domain, read addresses for entering data from the sending clock domain into the data storage elements, one at a time. The read address generator generates, controlled by a read clock signal from the clock generator of the receiving clock domain, read addresses for reading out data from the data storage elements in the same order as they were entered.

The tree shaped structure can have a first level of multiplexer elements connected to receive data in parallel from each of a number of the data storage elements. A number of following levels of storage elements are connected to receive data from a number of the multiplexer elements of the previous level. A last level includes a multiplexer element, on the output of which a data stream is emitted to the receiving clock domain.

More specifically, the multiplexer elements of the first level can each be connected to receive data from at least two of the data storage elements, and each of the multiplexer elements of the following levels can be connected to receive data from at least two of the multiplexer elements of the preceding level.

BRIEF DESCRIPTION OF THE DRAWINGS

Embodiments of the invention will now be described more closely with reference to the attached drawings.

On the drawings

DETAILED DESCRIPTION

Figure 1:
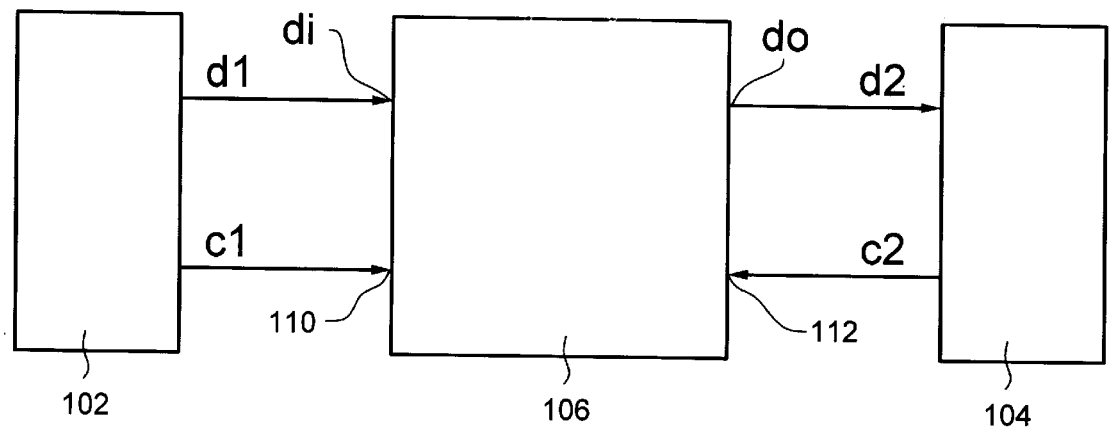
FIG. 1 is a principle diagram of a data transmission system.

In FIG. 1 102 and 104 each denotes a clock domain. The clock domains 102 and 104 may e.g. each be a CPU, a part of an ATM switch or some other equipment sending and receiving data respectively. The clock domain 102 has an internal clock oscillator which operates with a first clock speed, and the clock domain 104 has an internal clock oscillator operating with a second clock speed, which differs from the first clock speed.

Data shall be transmitted from the clock domain 102 to the clock domain 104. Because of the different clock speeds of the two clock domains, a buffer 106 must be present in the transmission stage, which causes serial data d1, leaving the first clock domain 102 with the first clock speed, to enter the second clock domain 104 in the form of serial data d2 with the second clock speed. The circuit 106 has a control input 110 for a clock signal c1 from the sending clock domain 102 and a control input 112 for a clock signal c2 from the receiving clock domain 104. A corresponding arrangement may be present in the opposite direction, i.e. from the clock domain 104 to the clock domain 102.

Figure 2:
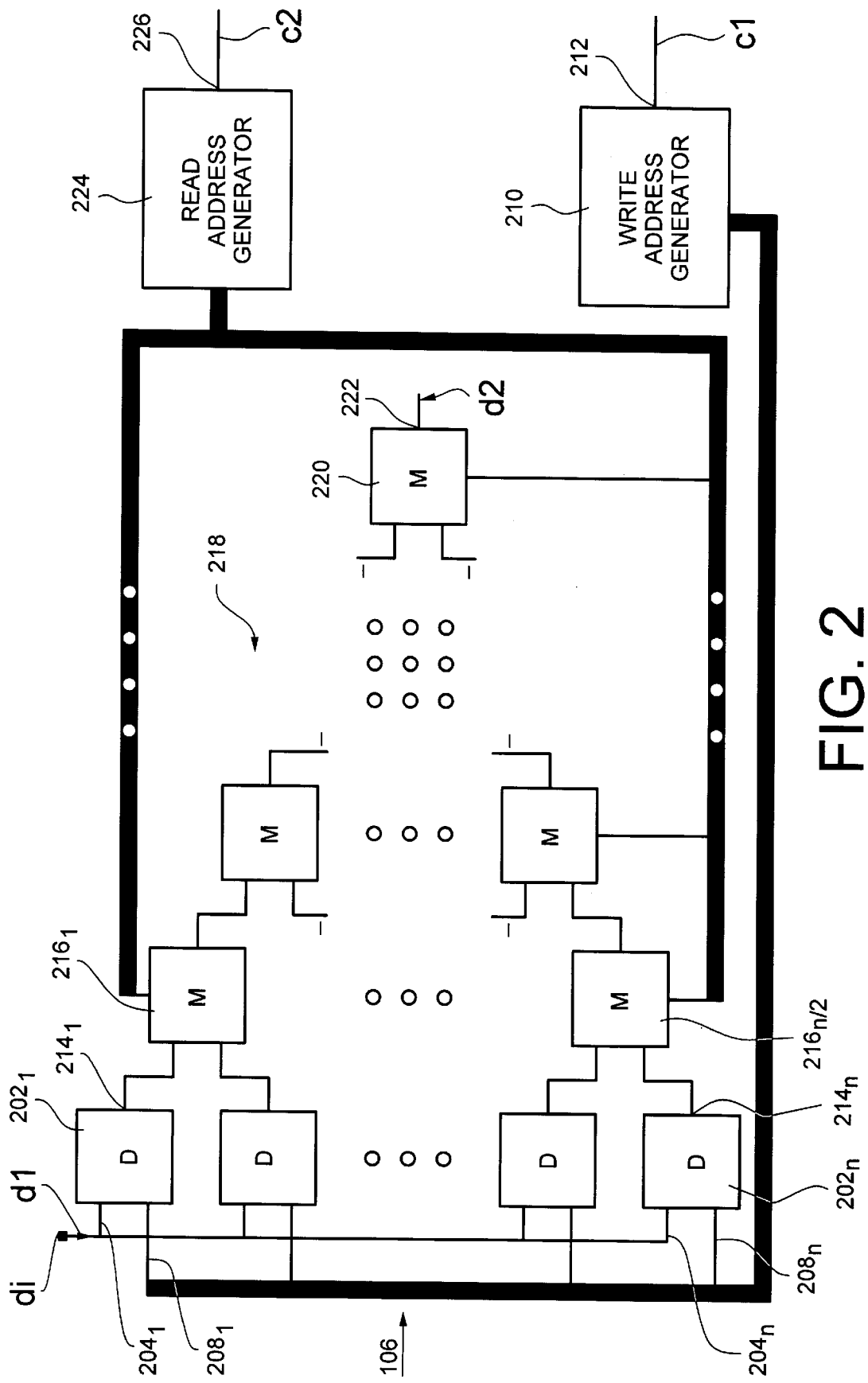
FIG. 2 shows a first embodiment of the data transmission system according to the invention.

The circuit in FIG. 2 corresponds to the buffer 106 in FIG. 1. It contains a number of data storage elements $202_1$ ... $202_n$, which are connected in parallel via each data input $204_1$ ... $204_n$ to the data input di which receives a serial data stream from the sending clock domain 102. The data storage elements $202_1 \ldots 202_n$ furthermore each have a control input $208_1 \ldots 208_n$. The control inputs $208_1 \ldots 208_n$ are connected to a write address generator 210, which, controlled by the clock signal arriving on a control input 212 from the clock of the sending clock domain 102, addresses the data storage elements $202_1 \ldots 202_n$, one by one, for entering therein data arriving on the data input di.

The data storage elements $202_1 \ldots 202_n$ each have a data output $214_1 \ldots 214_n$ and are pairwise connected with a respective data output $214_1 \ldots 214_n$ to a multiplexer in a first level of multiplexers $216_1 \ldots 216_{n/2}$. The multiplexers $216_1 \ldots 216_{n/2}$ form the top most level in a tree structure of multiplexers, indicated by an arrow 218, which are ended by an output multiplexer 220, from data output 222 of which the serial data stream d2 is supplied to the receiving clock domain 104.

A read address generator 224 is arranged, controlled by the clock signal c2 appearing on a control input 226 from the clock generator of the receiving clock domain 104, to read the multiplexers in the tree structure 218 in the same order as data has been entered into the data storage elements $202_1 \ldots 202_n$, for reading out data from the buffer 106.

The data storage elements may consist of data flip-flops, latches or other elements with memory functionality. As the man of the art well knows a data flip-flop enters and stores data at e.g. positive or negative edges of a control signal. As is also known a latch is transparent at a first logical level on the input, i.e. data on the input is visible on the output after a certain time delay, and this data content is stored at a second logical level, i.e. becomes insensitive to changes on the input.

As concerns the above mentioned multiplexers it may also here be the question of circuits of a type well known to the man of the art. As an example, circuits of flip-flop type may be mentioned, where data is entered on one input or the other on a rising and falling edge, respectively, of a control signal, or circuits of channel selector type. Circuits of the latter type may e.g. present two inputs and be made-up of two NAND gates, connected so that data on one input or the other may pass through in case of e.g. a 1 or 0, respectively, of a control signal.

Figure 3:
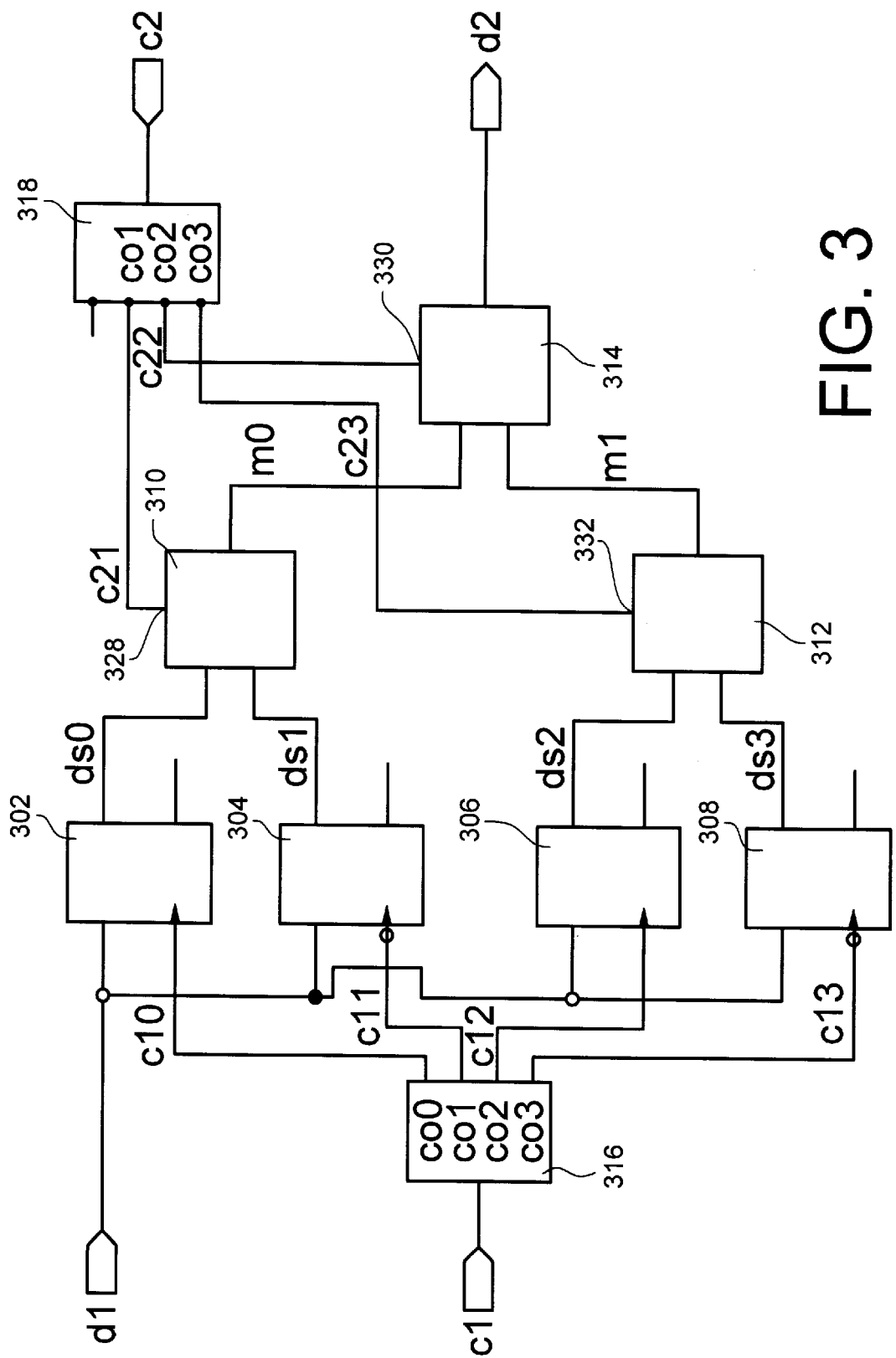
FIG. 3 shows a more detailed embodiment of the data transmission system according to FIG. 2.

A more detailed embodiment of the general embodiment of the invention indicated in FIG. 2 is shown in FIG. 3.

The circuit in FIG. 3 contains four data storage elements 302, 304, 306 and 308, corresponding to the data storage elements $202_1 \ldots 202_n$. The data storage elements 302, 304, 306 and 308 are here assumed to consist of edge triggered data flip-flops.

The data flip-flops 302, 304, 306 and 308 each have a data input and a control input connected in the same way as in FIG. 2. Thus, the data inputs in the same way as in FIG. 2 are connected in parallel to the data input di, which is connected to receive the serial data stream d1 from the sending clock domain, and the control inputs are, in a way to be explained closer below, connected to a read address generator. The control inputs of the data flip-flops 304 and 308 are inverted.

The tree structure in FIG. 3, corresponding to the tree structure 218 in FIG. 2, in this case only contains two levels of multiplexers, which in this case are assumed to consist of circuits of channel selector type of the kind mentioned above. The first level includes multiplexers 310 and 312, connected with their respective two inputs to receive data from the flip-flops 302 and 304, and 306 and 308, respectively. The respective data outputs of the multiplexers 310 and 312 are connected to each one of the two inputs of an output multiplexer 314 on the output level. On the data output of the multiplexer 314 the resulting serial data stream d2 is emitted to the receiving clock domain 104.

In FIG. 3 the read address generator is denoted 316 and the write address generator 318. An example of the realization of the read address generator is shown more in detail in FIG. 4.

Figure 4:
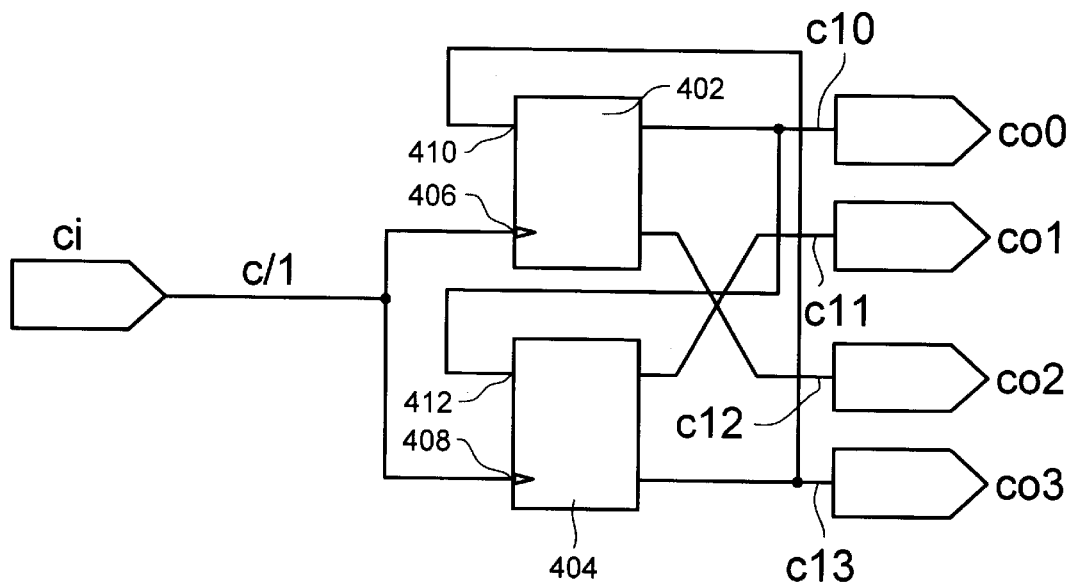
FIG. 4 shows an address generator included in the embodiment according to FIG. 3.

The read address generator according to FIG. 4 includes a four phase clock dividing circuit with two flip-flops 402 and 404, respectively. The flip-flops 402 and 404 on a respective control input 406 and 408, respectively, receive the clock signal c1 via an input ci. The flip-flops 402 and 404 further each have two clock outputs co0 and co2, and co1 and co3, respectively. The clock output co3 of the switch 404 is connected to an additional control input 410 of the switch 402, and the clock output co0 of the switch 402 is connected to an additional control input 412 of the switch 404.

The way of operation of a circuit of the kind shown in FIG. 4 is well known to the man of the art and need therefore not be described more closely here. It will, however, appear partially and indirectly in the below following description of the signal generation of the circuit in FIG. 3.

The clock outputs co0, co1, co2 and co3 are connected to each one of the control inputs, denoted 320, 322, 324 and 326, respectively, of the data flip-flops 302, 304, 306 and 308, respectively.

The read address generator 318 can be implemented in the same way as the above described write address generator 316, and the same description need thus not be repeated here. It receives on its control input the clock signal c2, and its clock outputs co1, co2 and co3 are connected to each of a control input 328, 330 and 332, respectively, of the multiplexers 310, 314 and 312, respectively.

Figure 5:
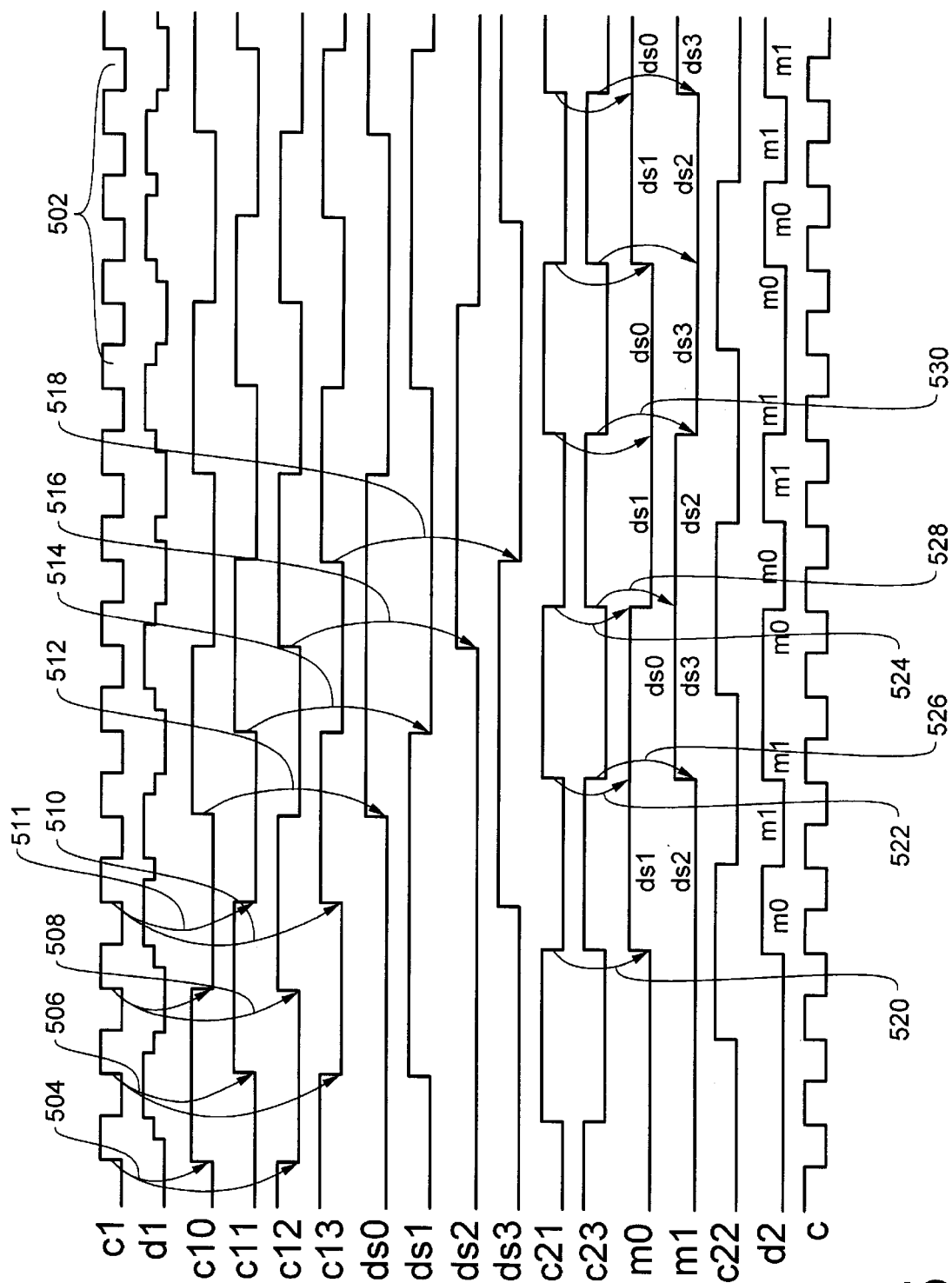
FIG. 5 shows signals appearing in the circuit according to FIGS. 3 and 4.

In FIG. 5 the signals appearing in FIGS. 3 and 4 are shown, the same designations of these signals being used in FIGS. 3 and 4. The clock signals received on the control inputs 320, 322, 324 and 326, respectively, of the data flip-flops 302, 304, 306 and 308, respectively, are denoted c10, c11, c12 and c13, respectively. The data signals from the data flip-flops 302 and 304 received on the two data inputs of the multiplexer 310 are denoted ds0 and ds1, respectively, and the data signals from the data flip-flops 306 and 308 received on the two data inputs of the multiplexor 312 are denoted ds2 and ds3, respectively. The output data signals from the multiplexers 310 and 312 on the two data inputs of the output multiplexer 314 are denoted m0 and m1, respectively. The clock signals from the clock outputs co1, co2 and co3 of the read address generator are denoted c21, c22 and c23, respectively.

On its first row FIG. 5 shows the clock signal c1 from the sending clock domain 102 on the control input ci of the write address generator 316. Thereafter follows, on the second row, the data signal including four bits 502 from the sending clock domain 102 on the data input of the data flip-flops 302, 304, 306 and 308, respectively.

If the system in FIG. 3 starts from 0 the first output clock signal with a rising edge will be c10, whereupon c11, c12 and c13, respectively, follow in the order mentioned. Each rising edge of c10–c13 will appear on each a rising edge of the clock signal c1 from the sending clock domain. That stated appears in FIG. 5 from the arrows 504, 506, 508 and 510, which lead from the rising edge of each one of a sequence of four consecutive pulses of the clock signal c1 to the rising edge of each one of consecutive pulses of the clock signals c10, c11, c12 and c13, respectively. It is also indicated by the respective additional arrows from the rising edge of the sequence in question of four pulses of the clock signal c1, that these rising edges also serve to end the respective previous pulse c12, c13, c10 and c11, respectively, cf. e.g. arrow 511 from the rising edge of the fourth c1 pulse to the falling edge of the first c11 pulse. In other words, each change of the signals c10–c13 occurs on the rising edge of a c1 pulse. This is a consequence of the feed-back loops leading to the control inputs 408 and 410 in FIG. 4.

It also appears from FIG. 5 that the frequency of the signals c10–c13 constitutes a fourth of the frequency of the clock signal c1.

As indicated by arrows 512, 514, 516 and 518 consecutive pulses of the data signals ds0, ds1, ds2 and ds3, respectively, appear on the rising edge of consecutive pulses of the clock signals c10, c11, c12 and c13, respectively.

The data signal m0 is composed of the data signals ds1 and ds0, and the data signal m1 is composed of the data signals ds3 and ds2. Arrows 520, 522 and 524 indicate that dsl and ds0 are chosen when the clock signal c21 is low and high, respectively. In a similar way arrows 526, 528 and 530 indicate that ds2 and ds3 are chosen when the clock signal c23 is high and low, respectively.

From FIG. 5 it finally also appears how the data signal d2 is composed of the data signals m0 and m1, which is achieved by the multiplexer 314 controlled by the clock signal c22.

What is claimed is:

1. A data transmission system, in which data streams shall be transmitted with great speed between a sending clock domain and a receiving clock domain, which operate with mutually different clock speeds, comprising a data buffer between the clock domains including a number of data storage elements having data inputs connected in parallel to an input for a data stream from the sending clock domain, a tree shaped structure of multiplexer elements, which are connected to receive data from the storage elements, and to emit a data stream to the receiving clock domain, a write address generator, which is controlled by a write clock signal from a clock of the sending clock domain and which generates read addresses for entering data from the sending clock domain into the data storage elements, one at a time, a read address generator, which is controlled by a read clock signal from a clock generator of the receiving clock domain and which generates read addresses for reading out data from the data storage elements in the same order as they were read in.

2. A system according to claim 1, wherein the tree shaped structure has a first level of multiplexer elements connected to receive data in parallel from each of a number of data storage elements, a number of following levels of storage elements, which are connected to receive data from a number of the multiplexer elements of a preceeding level, and a last level including a multiplexer element, on an output of which a data stream is emitted to the receiving clock domain.

3. A system according to claim 2, wherein each of the multiplexer elements of the first level are connected to receive data from at least two of the data storage elements, and each of the multiplexer elements of the following levels are connected to receive data from at least two of the multiplexer elements of the preceding level.

* * * * *